(12) United States Patent
Wijeratne et al.

(10) Patent No.: US 8,362,806 B2
(45) Date of Patent: Jan. 29, 2013

(54) KEEPER CIRCUIT

(75) Inventors: Sapumal B. Wijeratne, Portland, OR (US); Clifford L. Ong, Portland, OR (US); Hans J. Greub, North Plains, OR (US); Anandraj Devarajan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/459,113

(22) Filed: Jun. 26, 2009

(65) Prior Publication Data

US 2010/0327909 A1 Dec. 30, 2010

(51) Int. Cl.
*H03K 19/096* (2006.01)
(52) U.S. Cl. .......................... 326/95; 326/98
(58) Field of Classification Search ............ 326/93, 326/95, 97–98; 327/200, 201
See application file for complete search history.

(56) References Cited

U.S. PATENT DOCUMENTS

| | | | |
|---|---|---|---|
| 4,489,246 A * | 12/1984 | Nishiuchi | 326/120 |
| 5,075,571 A * | 12/1991 | Dhong et al. | 327/390 |
| 5,426,383 A * | 6/1995 | Kumar | 326/119 |
| 5,491,432 A * | 2/1996 | Wong et al. | 326/86 |
| 5,870,331 A | 2/1999 | Hwang et al. | |
| 6,104,642 A | 8/2000 | Blomgren et al. | |
| 6,204,696 B1 | 3/2001 | Krishnamurthy et al. | |
| 6,320,795 B1 | 11/2001 | Balamurugan et al. | |
| 6,466,057 B1 * | 10/2002 | Naffziger | 326/121 |
| 6,510,077 B1 | 1/2003 | Alvandpour et al. | |
| 6,510,092 B1 | 1/2003 | Mathew et al. | |
| 6,549,040 B1 | 4/2003 | Alvandpour et al. | |
| 6,597,223 B2 | 7/2003 | Vangal et al. | |
| 6,597,623 B2 | 7/2003 | Krishnamurthy et al. | |
| 6,614,680 B2 | 9/2003 | Alvandpour et al. | |
| 6,618,316 B2 | 9/2003 | Hsu et al. | |
| 6,628,143 B2 | 9/2003 | Hsu et al. | |
| 6,628,557 B2 | 9/2003 | Hsu et al. | |
| 6,690,604 B2 | 2/2004 | Hsu et al. | |
| 6,714,059 B1 * | 3/2004 | Choe | 327/200 |
| 6,791,365 B2 * | 9/2004 | Bosshart | 326/98 |
| 6,906,556 B2 * | 6/2005 | Choe | 326/95 |
| 7,109,757 B2 * | 9/2006 | Yuan et al. | 326/95 |
| 2003/0184344 A1 * | 10/2003 | Kumar et al. | 326/98 |
| 2005/0110522 A1 * | 5/2005 | Hoekstra | 326/95 |

* cited by examiner

*Primary Examiner* — James Cho
(74) *Attorney, Agent, or Firm* — Christopher K. Gagne

(57) ABSTRACT

Provided is a novel keeper circuit with a pull-up device whose strength changes for different operating supply levels so that the pull-up device is weaker for smaller supply levels and stringer for higher supply levels.

13 Claims, 4 Drawing Sheets

KEEPER CIRCUIT

TECHNICAL FIELD

The present invention relates generally to dynamic circuits and in particular to keeper circuits.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Keeper circuits are commonly used in dynamic circuits (e.g., logic gates, registers, etc.). Dynamic circuits have an evaluate node that is charged to a High level during a precharge phase and then during an evaluation phase, they are allowed to discharge (Low) or remain charged (High), depending on the input state(s) of input values for one or more pull down devices, which are coupled to the evaluate node. Keeper circuits are designed to assist in "keeping" the evaluate node charged High if it is suppose to evaluate High. Therefore, they need to be strong enough to resist noise, leakage, etc. that would otherwise cause the node to errantly discharge to a Low value. At the same time, however, they should be weak enough to allow the evaluate node to quickly discharge when it is suppose to discharge.

It is difficult for a keeper circuit to perform well over a range of different operational supply voltage levels because keeper strength should be relatively weak for low supply voltages and stronger for higher operating voltages. A weaker keeper is desired for lower supply levels to reduce contention with the pull-down stack(s), while a stronger keeper is desired for higher supply levels to obtain good noise robustness.

Figure 1:
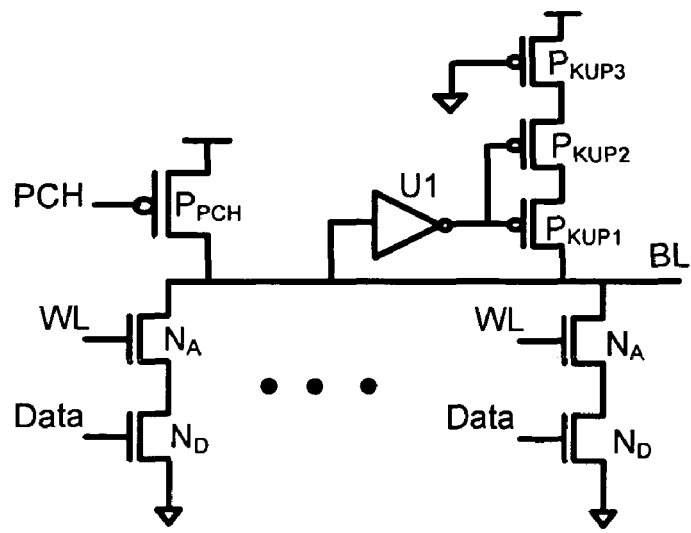
FIG. 1 is a diagram of a prior art keeper circuit.

FIG. 1 shows a dynamic circuit portion with a conventional keeper circuit. In this example, the dynamic circuit is a portion of a register file circuit, but it should be appreciated that dynamic circuits can be employed for other dynamic circuit applications including other memory applications, logic gates, and other implementations. The depicted register circuit has an evaluate node (referred here as "BL" for bit line since the evaluate node here serves as a register bit line), pull-down logic stacks formed from N-type transistors ($N_A$, $N_D$), a P-type charging transistor ($P_{PCH}$), and a keeper circuit formed from inverter U1 and P-type transistors ($P_{KUP1}$ to $P_{KUP3}$).

In operation, during a precharge phase, the pull-down (logic) stacks ($N_A$ and/or $N_D$) are turned off, and the charging transistor ($P_{PCH}$) is turned on to charge up the BL node to a High level. This causes the Keeper transistors ($P_{KUP1}$, $P_{KUP2}$, $P_{KUP3}$) to turn on to assist in holding up the BL node. Then, for an evaluate phase, the precharge signal (PCH) to the precharge transistor ($P_{PCH}$) goes High to turn off the charging transistor. Depending on the input values (WL, Data) applied to the logic stack transistors, if both transistors in any logic stack turn on, the BL node is discharged through the "turned on stack", causing the BL node to evaluate "Low." On the other hand, if the values are such that no logic stack turns on, then the BL node stays charged and evaluates High (or at least it is suppose to stay High). This is the function of the keeper, i.e., to assist the BL node when it is to evaluate High to stay sufficiently High, notwithstanding leaky logic stack transistors, noise, and other problematic factors.

With this prior art example, the keeper pull-up device is formed from three "pull-up" transistors ($P_{KUP1}$, $P_{KUP2}$, and $P_{KUP3}$), stacked atop one another and coupled between the BL node and the supply voltage to hold up the BL node. (Note that while three stacked devices are used here, e.g., for design convenience to achieve a desired overall strength, any suitable number or configuration could be used for the keeper pul-up section.) During the evaluate phase, each keeper pull-up transistor is turned on with a solid Low and thus, the effective keeper pull-up strength is fixed. Unfortunately, this makes it difficult to achieve desired results for both low and high supply voltage levels. e.g., supply voltages ranging from 0.8V to 1.3V. For the lower supply levels, the pull-down (logic) stacks can become significantly weaker and thus have a difficult time overcoming the keeper pull-up transistors when trying to properly discharge the BL node. On the other hand, for higher supply levels, supply noise, logic stack leakage, etc. becomes more pronounced, and the keeper may not be strong enough for desired reliability.

Some prior art approaches have addressed this by using a programmable keeper (i.e., a keeper with a weak and a strong setting). They may have two or more separately selectable pull-up devices, or they may have circuitry such as body biasing circuitry to change the strength of one or more pull-up devices. Unfortunately, such solutions can require excessive circuit resources, e.g., separate low and high supplies, separately engageable keeper device options, and logic to dynamically select the appropriate keeper strength based on the operating supply voltage.

Another prior art keeper solution (referred to as "delayed keeper") employs no keeper or a weak keeper during the initial part of the domino evaluation phase, and then switches to a strong keeper for the remainder of the evaluate phase. This solution requires a timer circuit to time the switching point of when the keeper from "weak" or no keeper to strong, which can make it complicated. In addition, during the onset of evaluation, the keeper is very weak, or nonexistent, increasing the risk of a noise induced failure.

Figure 2:
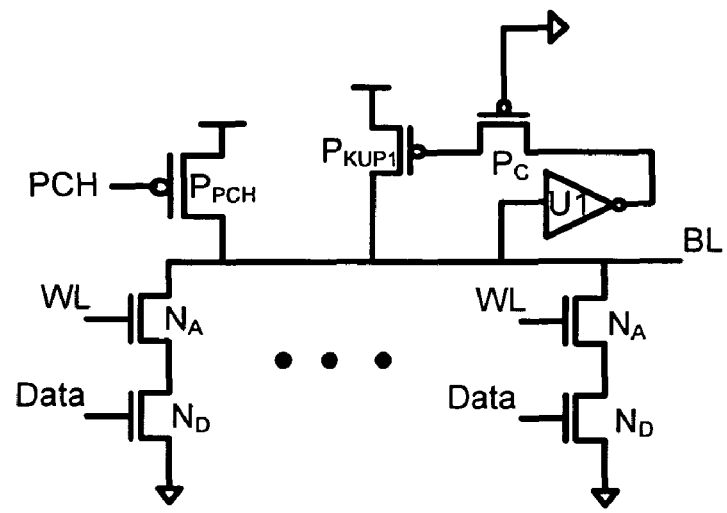
FIG. 2 is a diagram of another prior art keeper circuit.

FIG. 2 shows yet another prior art keeper approach, the so-called CASK (Contention Alleviated Static Keeper). It has a control transistor ($P_C$) coupled between the inverter U1 and the gate of the keeper pull-up device $P_{KUP1}$ to control it to be turned on more weakly by providing a $V_{TP}$ voltage at the gate of the pull-up transistor ($P_{KUP1}$). A problem with this approach is that if the BL node BL stays high for an extended period of time (which is not uncommon when the circuit is in precharge or evaluating High), the gate of the keeper pull-up transistor discharges from $V_{TP}$ down to Vss after some time and stay at Vss. At that point, the keeper pull-up device is fully turned on and thus may present contention problems for the logic stacks during the next evaluate phase.

Figure 3:
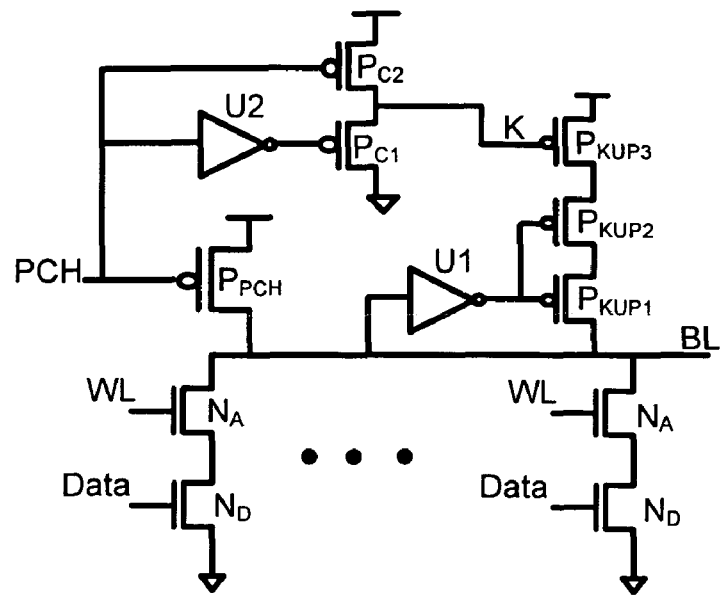
FIG. 3 is a diagram of a keeper circuit in accordance with some embodiments of the invention.

With reference to FIG. 3, an embodiment for a novel keeper circuit is depicted. The depicted keeper comprises three stacked pull-up transistors ($P_{KUP1}$ to $P_{KUP3}$), inverters (U1, U2) and control transistors ($P_{C1}$, $P_{C2}$), coupled as shown. The pull-up stack includes $P_{KUP3}$, which is controlled by $P_{C1}$, $P_{C2}$, and U2 in response to the precharge (PCH) signal so as to vary $P_{KUP3}$ inn strength for different supply voltage levels. It is driven by $P_{C1}$ and $P_{C2}$, setting the node 'k' (gate of the variable strength pull-up keeper transistor $P_{KUP3}$) at a voltage near the threshold voltage drop for control transistor ($P_{C1}$). Thus, given that node K is at $V_{TP}$, as compared to Vss as is the case with many prior art designs, during evaluation, the effective overdrive voltage for $P_{KUP3}$ is Vcc-$2V_{TP}$, which is less (by an amount $V_{TP}$) than if its gate were connected to Vss. (The overdrive voltage corresponds to the transistor's strength. For P-type transistors, overdrive voltage is the effective voltage applied to the gate beyond $V_{TP}$.)

So, in operation, for a precharge phase, PCH goes Low, turning on the precharge transistor $P_{PCH}$, thereby causing node K to go to Vcc. This turns off the variable keeper pull-up transistor ($P_{KUP3}$). On the other hand, for an evaluation phase, PCH goes High, turning on $P_{C1}$ and turning off $P_{C2}$. This causes node K to discharge, e.g., rapidly. Because the discharge path is through a PMOS device ($P_{C1}$), when node K discharges down to around $V_{TP}$, $P_{C1}$ stops conducting and enters a sub-threshold region, resulting in node K stabilizing at around VTP.

Note that given a sufficiently long period of time, node K would otherwise discharge (albeit relatively slowly) down to Vss. However, due to the presence of the $P_{C2}$, which is in sub-threshold mode of operation (resulting, e.g., from leakage), $P_{C2}$ supplies current (leakage current) to sustain node K at around $V_{TP}$.

Thus, the control circuitry (U2, $P_{C1}$, $P_{C2}$) controls the keeper to provides sufficiently high keeper strength at high supply voltages because the strength of PKUP3 corresponds to how hard it is overdriven (Vcc-$2V_{TP}$). So, as Vcc increases, there is sufficient overdrive voltage to provide $P_{KUP3}$ (and thus, the keeper pull-up stack) with suitable strength. At the same time, however, the control circuit enables the keeper to be weakened at a fast enough rate when the supply voltage decreases, i.e., the overdrive level pinches sufficiently as Vcc decreases. (Note that this is affected by the operating supply voltage range, as well as by physical transistor properties such as $V_{TP}$, although suitable $V_{TP}$ values and circuit configurations, along the lines taught herein, may be made for desired supply voltage ranges.) A beneficial aspect of this embodiment is that the keeper strength weakens on a continuous basis as the supply voltage changes, which is in contrast with some prior art embodiments that use separate switchable or engageable keeper strengths.

Figure 4:
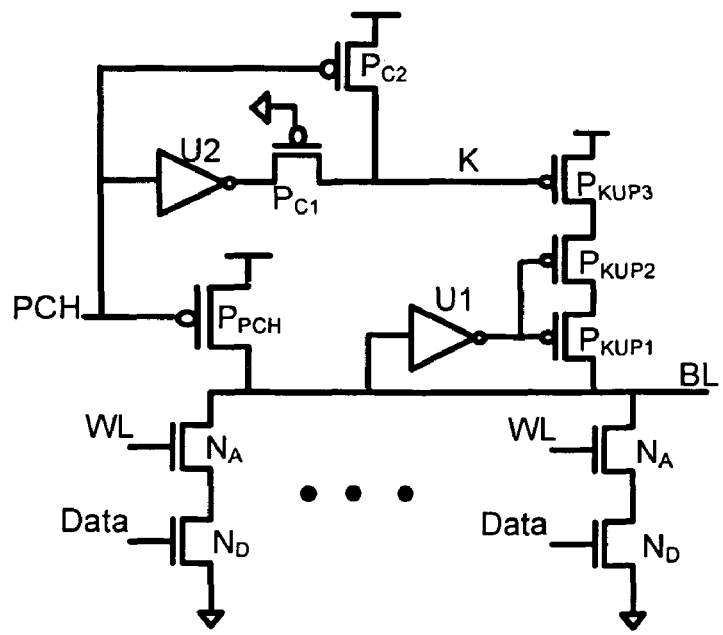
FIG. 4 is a keeper circuit in accordance with additional embodiments of the invention.

FIG. 4 shows another keeper embodiment. It is slightly modified by changing the connections of control transistor $P_{C1}$ such that its connection to node 'k' stays the same, but the connections for its gate and the other diffusion terminal (drain or source depending on desired design considerations) are swapped. This illustrates that the circuit components may be re-arranged, and as shown below, removed or augmented, in numerous different ways to attain desired results as taught herein.

Figure 5:
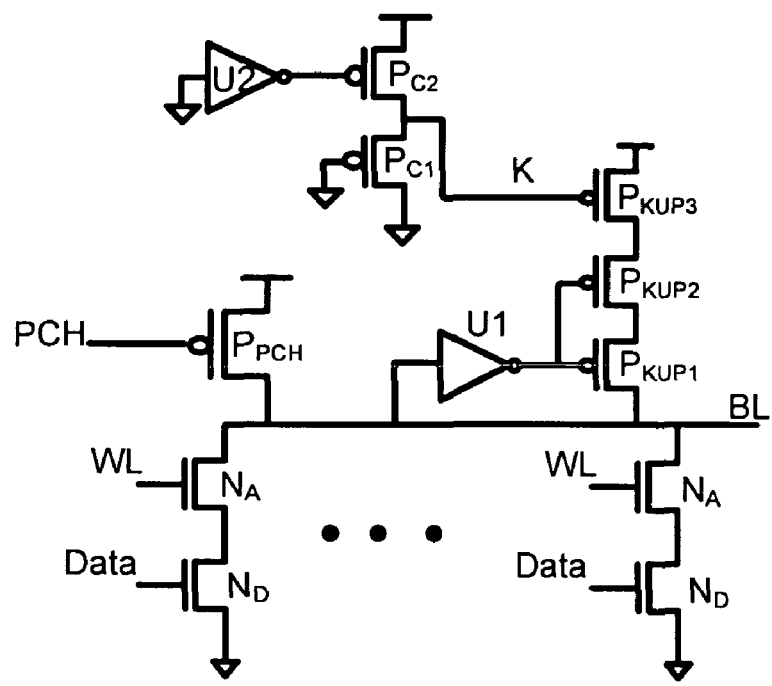
FIG. 5 is a keeper circuit in accordance with yet additional embodiments of the invention.

FIG. 5 shows yet another embodiment where the control portion is modified to make its operation independent of the precharge (PCH) clock, making it static. The node K no longer pre-charges to Vcc but converges to the voltage division level for $P_{C1}$ and $P_{C2}$ as they are configured. They hold node K near $V_{TP}$ and avoid long term drift, e.g., due to noise sources, but this may not be as ideal as with the previous embodiments, which repeatedly refreshed charging K via a precharge clock. On the other hand, less components are required and thus, as with most designs, trade-offs may be made differently for different design problems.

Figure 6:
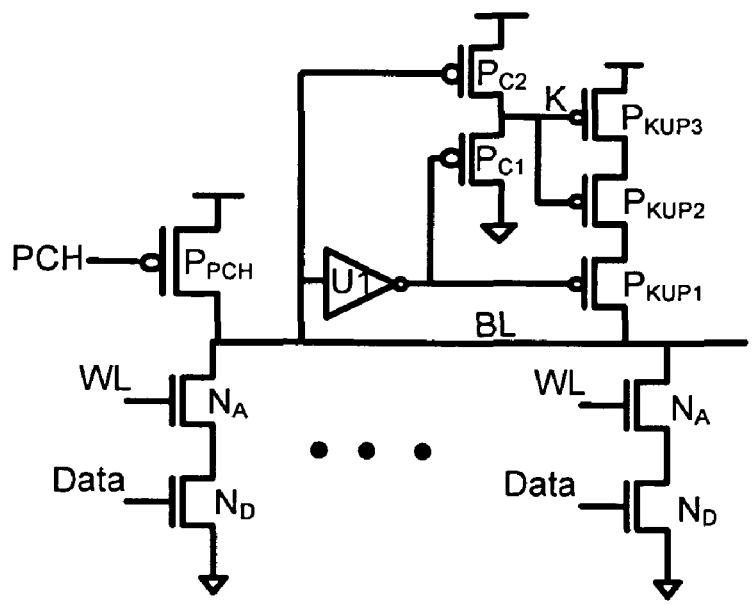
FIG. 6 is a keeper circuit in accordance with still additional embodiments of the invention.

FIG. 6 shows another variation of the circuit of FIG. 3 but modified such that the bit line is used instead of the PCH clock. Here, the control transistor $P_{C2}$ is driven by the bit line itself, and the first inverter (U1) is reused to drive the control transistor $P_{C1}$. An advantage of this embodiment is that the extra loading on the precharge clock is eliminated and two transistors (for the second inverter) can be omitted. The tradeoff is that the circuit is more susceptible to noise since a droop on the bit line will cause $P_{C2}$ to slightly conduct and hence node K will slightly rise above $V_{TP}$, further weakening the keeper pull-up stack in the presence of noise.

It can be seen that there are beneficial aspects of some of the embodiments disclosed herein. To begin with, the control circuit turns on $P_{C1}$ during every precharge phase, causing node K to repeatedly be refreshed. In addition, the control transistors are configured to operate at leakage levels, thereby promoting power savings. Another benefit of the embodiment of FIG. 2 is that It improves min. voltage performance, even with "noisy" domino evaluate nodes. Typically, a domino evaluate node may operate in a very noisy environment, for example, when long global bit lines (evaluate node) with limited shielding are used. In such cases, the noise risk is high and thus, traditional approaches have employed strong keepers to err on the side of caution. Because disclosed embodiments can perform well with regard to noise robustness for high supply voltages, at least when compared to some prior art solutions, such embodiments are able to improve min. supply voltage performance for noisy domino bit lines because the keepers weaken for lower supply voltages where noise sources are not as problematic.

It should be appreciated that embodiments disclosed herein are universally applicable for any type of domino evaluation node (e.g., bit line) keeper circuit applications. For example, it may be available to either local or global bit lines in dynamic memory applications, whether there is opportunistic pre-charging of inactive local bit lines to reduce noise or not, and whether the bit line is noisy or not.

Figure 7:
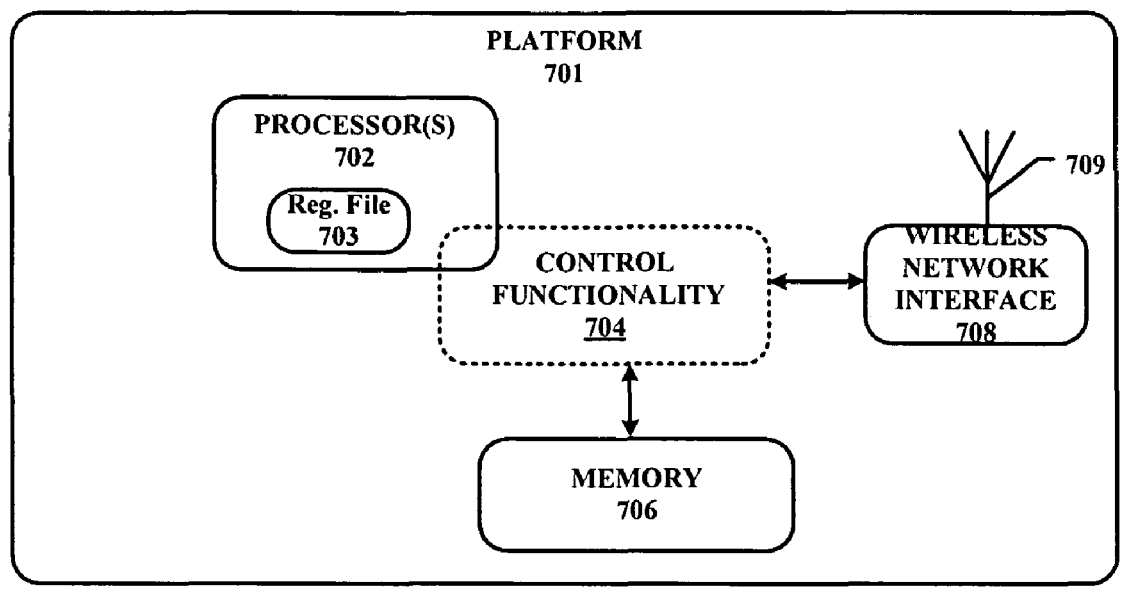
FIG. 7 is a diagram of a computer system having a microprocessor with a register file having keeper circuits in accordance with some embodiments.

With reference to FIG. 7, one example of a portion of a computer platform 701 (e.g., computing system such as a mobile personal computer, PDA, cell phone, or the like) is shown. The represented portion comprises one or more processors 702, interface control functionality 704, memory 706, wireless network interface 708, and an antenna 709.

The processor(s) 702 includes one or more register file circuits 703, each with bit lines using novel keeper circuits as taught herein. The processor is coupled to the memory 706 and wireless network interface 708 through the control functionality 704. The control functionality may comprise one or more circuit blocks to perform various interface control functions (e.g., memory control, graphics control, I/O interface control, and the like. These circuits may be implemented on one or more separate chips and/or may be partially or wholly implemented within the processor(s) 702.

The memory 706 comprises one or more memory blocks to provide additional random access memory to the processor(s) 702. It may be implemented with any suitable memory including but not limited to dynamic random access memory, static random access memory, flash memory, or the like. The wireless network interface 708 is coupled to the antenna 709 to wirelessly couple the processor(s) 702 to a wireless network (not shown) such as a wireless local area network or a cellular network.

The platform 701 may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS" or "P-type" transistor refers to a P-type metal oxide semiconductor field effect transistor. Likewise, "NMOS" or "N-type" transistor refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit (IC) chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the presented figures, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
a keeper circuit with a pull-up transistor for an evaluate node, the pull-up transistor having a gate coupled to a control node,
a first control transistor coupled between the control node and a low reference; and
a second control transistor coupled between the control node and a high reference, the control node to transition to activate the pull-up transistor before the evaluate node is to complete an evaluation, an output of an inverter being coupled to one of the first control transistor and the second control transistor, the other of the first control transistor and the second control transistor being coupled to a voltage of an input of the inverter, the first control transistor and the second control transistor being of same conductivity type, the first control transistor to be turned on for an evaluate phase and the second control transistor to be turned off for the evaluate phase.

2. The chip of claim 1, in which the first and second control transistors are P-type transistors.

3. The chip of claim 1, wherein the low reference is provided from the output of the inverter.

4. The chip of claim 3, in which the inverter is controlled to a precharge clock node to output the low reference when the precharge clock is High.

5. The chip of claim 1, in which the at least one pull-up transistor is part of a pull up stack having one or more P-type transistors.

6. The chip of claim 1, in which the first and second control transistors are P-type transistors.

7. The chip of claim 6, in which the first control transistor is turned off for a precharge phase and the second control transistor is turned on for the precharge phase.

8. The chip of claim 7, in which the first control transistor is controlled by the inverter and the inverter is coupled to a precharge clock node.

9. An electronic device, comprising:

a processor with one or more register file circuits having a keeper circuit with a pull-up transistor for an evaluate node, a first control transistor, and a second control transistor, the pull-up transistor having a gate coupled to a control node, the first control transistor coupled between the control node and a low reference, and the second control transistor coupled between the control node and a high reference, the control node to transition to activate the pull-up transistor before the evaluate node is to complete an evaluation, an output of an inverter being coupled to one of the first control transistor and the second control transistor, the other of the first control transistor and the second control transistor being coupled to a voltage of an input of the inverter, the first control transistor and the second control transistor being of same conductivity type, the first control transistor to be turned on for an evaluate phase and the second control transistor to be turned off for the evaluate phase; and an antenna coupled to the processor through a network interface to communicatively link it to a wireless network.

10. The device of claim 9, in which the first and second control transistors are P-type transistors.

11. The device of claim 9, wherein the low reference is provided from the output of the inverter.

12. The device of claim 11, in which the inverter is controlled by a precharge clock node to output the low reference when the precharge clock is High.

13. The device of claim 9, in which the pull-up transistor is part of a pull up stack having one or more P-type transistors.

* * * * *